United States Patent [19]
Spencer et al.

[11] Patent Number: 5,401,953
[45] Date of Patent: Mar. 28, 1995

[54] OPTICALLY-SWITCHED SUBMILLIMETER-WAVE OSCILLATOR AND RADIATOR HAVING A SWITCH-TO-SWITCH PROPAGATION DELAY

[75] Inventors: Michael G. Spencer, Washington, D.C.; Joseph Maserjian, Valencia, Calif.

[73] Assignee: The United States of America as represented by the Administrator of the National Aeronautics and Space Administration, Washington, D.C.

[21] Appl. No.: 125,966

[22] Filed: Sep. 23, 1993

[51] Int. Cl.⁶ ............................................. H01J 40/14
[52] U.S. Cl. ................................. 250/208.4; 330/4.5; 372/4; 250/214.1
[58] Field of Search ............ 250/208.4, 214 R, 214.1, 250/227.11; 330/4.5, 4.6; 324/76.36, 76.54; 343/767, 746, 700 MS; 372/4.2, 20, 37; 257/604; 359/326, 330

[56] References Cited

U.S. PATENT DOCUMENTS

| | | |
|---|---|---|
| 3,566,140 | 2/1971 | Granqvist . |
| 3,777,149 | 12/1973 | Marcatili . |
| 3,958,189 | 5/1976 | Sprangle et al. .................... 372/4 |
| 4,164,373 | 8/1989 | Schuss et al. . |
| 4,296,319 | 10/1981 | Franks et al. . |
| 4,356,395 | 10/1982 | Miller . |
| 4,364,639 | 12/1982 | Sinclair et al. . |
| 4,405,199 | 9/1983 | Lyons-. |
| 4,475,197 | 10/1984 | Tanton et al. ......................... 372/4 |
| 4,558,920 | 12/1985 | Newton et al. . |
| 4,954,864 | 9/1990 | Maserjian . |
| 4,959,540 | 9/1990 | Fan et al. . |
| 5,099,471 | 3/1992 | Tsukada et al. . |
| 5,111,519 | 5/1992 | Mathis . |

Primary Examiner—David C. Nelms
Assistant Examiner—Que T. Le
Attorney, Agent, or Firm—John H. Kusmiss; Thomas H. Jones; Guy M. Miller

[57] ABSTRACT

A submillimeter wave-generating integrated circuit includes an array of N photoconductive switches biased across a common voltage source and an optical path difference from a common optical pulse of repetition rate $f_0$ providing a different optical delay to each of the switches. In one embodiment, each incoming pulse is applied to successive ones of the N switches with successive delays. The N switches are spaced apart with a suitable switch-to-switch spacing so as to generate at the output load or antenna radiation of a submillimeter wave frequency f on the order of $Nf_0$. Preferably, the optical pulse has a repetition rate of at least 10 GHz and N is of the order of 100, so that the circuit generates radiation of frequency of the order of or greater than 1 Terahertz.

34 Claims, 7 Drawing Sheets

OPTICALLY-SWITCHED SUBMILLIMETER-WAVE OSCILLATOR AND RADIATOR HAVING A SWITCH-TO-SWITCH PROPAGATION DELAY

BACKGROUND OF THE INVENTION

1. Origin of the Invention

The invention described herein was made in the performance of work under a NASA contract, and is subject to the provisions of Public Law 96-517 (35 USC 202) in which the Contractor has elected not to retain title.

2. Technical Field

The invention is related to submillimeter wave generators and in particular to a submillimeter wave generator which does not depend upon non-linear semiconductor processes to produce power, but rather employs optically-controlled electronic switches connected to a voltage source providing the submillimeter radiation power.

3. Background Art

There are no efficient submillimeter wave sources operating in the 300 to 3000 GHz region which are lightweight and produce on the order of a milliwatt power, despite current efforts to find such a source. The need for efficient local oscillators for heterodyne mixers in the 300 to 3000 GHz region is critical because of the potential applications in space-based submillimeter wave imaging radar, non-destructive testing, plasma diagnostics, weapon and contraband detection and communications. Such local oscillators must have reasonable power (in the range of milliwatts up to watts) and are required to cover a wide spectral range. The art has made numerous unsuccessful attempts to meet this need, but so far there appears to be little prospect of succeeding, as will now be described.

Lasers developed for this purpose are (individually) restricted to essentially one single wavelength. Some tunability can be achieved by optical techniques, but only over very limited bandwidth.

Microwave generators capable of generating submillimeter waves, such as carcinotrons, do not operate efficiently at wavelengths shorter than one millimeter and are excessively heavy, consume considerable power and have short lifetimes, making them relatively unsuitable to use in space flight.

Available solid state oscillators, such as GaAs Gunn diodes and IMPATT diodes are highly efficient and tunable but are limited to frequencies up to about 75 and 125 GHz, respectively, because of fundamental limitations on maximum current density in such devices. Recent research on quantum well negative differential resistance devices or oscillators has produced results characterized by very low power (less than microwatts) at much higher frequencies than the solid state oscillators discussed above. Higher frequencies (up to 500 GHz) have been achieved also by generating harmonics of the oscillator frequency using solid state nonlinear devices such as GaAs varactors or varistors. This approach is limited by reduced power output at the higher frequencies, typically less than microwatts. As disclosed in U.S. Pat. No. 4,954,864 by Joseph Maserjian, one of the inventors herein, some attempts have been made to partially overcome this limitation using large arrays of such devices. However, the highest frequencies achieved in such quantum well devices are on the order of only 500 GHz because of fundamental limitations.

Thus, it has not seemed possible to provide a submillimeter wave source operating in the 1000 to 3000 GHz frequency range with power output on the order of milliwatts.

It is therefore an object of the invention to produce submillimeter waves without relying upon nonlinear semiconductor devices such as PN junctions and quantum wells to provide the power, so as to escape the fundamental constraints which so far have held submillimeter power output at 500 GHz to sub-microwatt levels.

It is a further object of the invention to provide on a single semiconductor substrate a submillimeter wave source capable of producing submillimeter waves with at least one milli-watt power at frequencies between 300 GHz and 3000 GHz.

It is another object of the invention to provide a submillimeter wave source meeting the foregoing objectives and further having a tunable submillimeter wave output frequency.

These and other objects and advantages of the invention will become apparent in the following detailed description when taken in conjunction with the accompanying drawings.

SUMMARY OF THE DISCLOSURE

In one embodiment, the invention is a submillimeter wave-generating circuit, including a linear array of plural photoconductive switches, apparatus for biasing the switches across a common voltage source, an output load connected to one end of the array, and apparatus for applying an optical pulse beam of repetition rate $f_0$ to the plural switches so as to generate electrical pulses from the switches traveling along the linear array toward the output load, wherein the plural switches are spaced apart by a spacing D to provide a corresponding switch-to-switch propagation delay of the electrical pulses, whereby arrival times of the electrical pulses at the output load are spaced apart by an arrival period corresponding to a desired submillimeter wave frequency f which is a function of the switch-to-switch propagation delay. In accordance with one aspect, the invention further includes optical delay apparatus for delaying arrival of the optical pulse at successive ones of the switches with successively increasing optical delay times corresponding to a switch-to-switch optical delay difference, whereby the arrival period corresponding to the submillimeter wave frequency f is a function of both the switch-to-switch propagation delay and the optical delay difference. The invention can include tuning apparatus for varying the optical delay difference so as to change the submillimeter wave frequency f.

In accordance with one implementation, the array of switches includes a number of switches not exceeding N, wherein N is on the order of $f/f_0$. The optical delay apparatus in one version includes apparatus for disposing the linear array at an angle $\Theta$ relative to the optical pulse. The arrival period is independent of N and is $1/f = (D/c)(n - \sin \Theta)$, wherein c is the speed of light and n is an applicable index of refraction.

Generally, the optical delay apparatus includes a wedge-shaped optical medium, which may be either a vacuum or a refractive medium, between a source of the optical pulse and the array of switches. In one version, the optical delay apparatus includes an array of optical fiber channels of successively increasing optical lengths disposed generally perpendicular to the array of switches, each optical fiber channel facing a respective one of the switches, respective ones of the optical fiber channels having respective lengths corresponding to respective optical delays.

In accordance with one implementation, the apparatus for biasing includes metal conductors overlying a highly resistive photoconductive layer and having gaps therein forming each of the switches, the circuit further including a thin film insulated capacitor plate connected to one of the conductors and overlying another one of the conductors along a major portion of the length of the other conductor, the capacitor plate providing a local charge source for each of the switches. Preferably, the output load is a free-space radiating antenna connected across the metal conductors. One end of the capacitor plate and one end of the one conductor lie at one end of the array of switches, the antenna being connected across the one end of the capacitor plate and the one end of the one conductor.

In accordance with another embodiment, the invention is a free-space radiating multi-watt submillimeter wave source, including an integrated circuit substrate, an optically active semiconductor layer overlying the substrate, a linear array of opposing metal finger pairs overlying the optically active layer with thin gaps between opposing fingers of each pair, adjacent ones of the gaps being separated by a uniform spacing D for a gap-to-gap propagation delay corresponding to a submillimeter wave frequency regime, a pair of bias bus conductors connected to respective ones of the opposing metal finger pairs, an antenna connected at a first terminal thereof to one of the bias bus conductors at one end of the linear array, and a thin film capacitor having one capacitor plate overlying a major portion of one of the bias bus conductors and connected to a second terminal of the antenna and a dielectric layer lying between the capacitor plate and the underlying one bias bus conductor. The substrate is illuminated with a pulsed optical beam. This embodiment further includes apparatus for preventing light from interacting with the optically active semiconductor layer in a region between adjacent finger pairs. In one implementation, the apparatus for preventing light from interacting with the optically active semiconductor layer in a region between adjacent finger pairs includes open voids in the optically active semiconductor layer in regions bounded by adjacent ones of the gaps. In another implementation, the apparatus for preventing light from interacting with the optically active semiconductor layer in a region between adjacent finger pairs includes an opaque layer overlying discrete regions of the optically active semiconductor layer between adjacent ones of the gaps.

This embodiment can further include apparatus for imposing respective optical delays on arrival of a pulsed optical beam at successive ones of the gaps, whereby the antenna radiates at a submillimeter wave frequency which is a function of both the gap-to-gap propagation delay and a difference between the optical delays at adjacent gaps. Generally, the apparatus for imposing optical delays includes a wedge-shaped optical medium in an optical path to the gaps. In one implementation, the apparatus for imposing optical delays includes a wedge of plural successive optical fibers of successively increasing lengths in alignment with respective ones of the gaps at one end thereof for receiving a pulsed optical beam at an opposite end thereof. In the preferred embodiment, however, the apparatus for imposing optical delays includes apparatus for disposing the array at an off-normal angle relative to an incident pulsed optical beam.

In an alternative embodiment, a submillimeter wave-generating circuit includes a two-dimensional planar array of photoconductive switches including plural linear arrays of the plural photoconductive switches, apparatus for biasing the switches across a common voltage source, an output load connected to one end of each one of the linear arrays, and apparatus for applying an optical pulse beam of repetition rate $f_0$ to the plural switches so as to generate electrical pulses from the switches traveling along each one of the linear arrays toward the respective output loads, wherein the plural switches within each linear array are spaced apart by a spacing D to provide a corresponding switch-to-switch propagation delay of the electrical pulses, whereby arrival times of the electrical pulses at each one of the output loads are spaced apart by an arrival period corresponding to a desired submillimeter wave frequency f which is a function of the switch-to-switch propagation delay. This alternative embodiment can include optical delay apparatus for delaying arrival of the optical pulse at successive ones of the switches in each linear array with successively increasing optical delay times corresponding to a switch-to-switch optical delay difference, whereby the arrival period corresponding to the submillimeter wave frequency f is a function of both the switch-to-switch propagation delay and the optical delay difference. It can also include tuning apparatus for varying the optical delay difference so as to change the submillimeter wave frequency f.

In one implementation of the latter embodiment, each one of the linear arrays of switches includes a number of switches not exceeding N, wherein N is on the order of $f/f_0$. Preferably, the optical delay apparatus includes apparatus for disposing the linear array at an angle $\Theta$ relative to the optical pulse, so that the arrival period is independent of N and is $1/f = (D/c)(n - \sin \Theta)$, wherein c is the speed of light and n is an applicable index of refraction.

In accordance with a second alternative embodiment of the invention employing a single switch, the submillimeter wave source includes a photoconductive switch biased across a voltage source and having an output load coupled thereto, apparatus for generating multiple delayed reflections of a single pulsed optical beam of repetition rate $f_0$, successive ones of the reflections being spaced in time by successive optical delay differences corresponding to a submillimeter wave frequency f, and apparatus for focusing the multiple delayed reflections of the beam onto the photoconductive switch. In one implementation, the apparatus for generating multiple delayed reflections includes a mirrored cavity having a top reflective surface and a bottom surface facing the top reflective surface, the bottom reflective surface being partially reflective and partially transmissive in a direction toward the apparatus for focusing. The apparatus for generating the reflections generates N reflections of the beam, wherein $N = f/f_0$.

The invention is also embodied in a method of generating submillimeter wave radiation using an integrated circuit having a linear array of photoconductive switches biased across a voltage source with an output load at one end thereof and characterized by a spacing D corresponding to a switch-to-switch propagation delay, the method including illuminating the linear array with a pulsed laser beam of repetition rate $f_0$, and holding the array at an angle $\Theta$ relative to a normal to an optical path of the laser beam so as to impose an optical delay difference in arrival of each pulse of the beam at adjacent ones of the switches. The output load receives successive pulses from the switches at a submillimeter wave frequency $f = 1/[(D/c)(n - \sin \Theta)]$, wherein c is the speed of light and n is a factor related to an index of refraction. This method further includes a tuning step of rotating the array so as to varying the angle $\Theta$ to change the frequency of the submillimeter wave radiation.

DETAILED DESCRIPTION OF THE PREFERRED EMBODIMENTS

Introduction

The invention is a semiconductor integrated circuit having a multiplicity (N) of semiconductor switches of the Auston type independently triggered by laser pulses of repetition rate $f_0$ derived through a corresponding multiplicity of current pulse delays from each single laser pulse. The output frequency f of the circuit is determined by the time separation, $1/f$, between the delays. Ideally, for maximum output power the multiplicity of N delays fills the period $1/f_0$ between laser pulses, so that $N = f/f_0$. If N is less than this ideal value, the total power of the Fourier component at the output frequency f is reduced accordingly, but may still be sufficient. This feature allows flexibility in making tradeoffs between array size (complexity) and useful power output.

The limitations on power output and frequency referred to previously with reference to the prior art are overcome in the invention because the laser-activated switching action does not suffer from the same serious limitations on current density and parasitic (RC) effects.

In one simplified embodiment, the switches are in a linear array and are connected in parallel across a voltage source and an output load with a microstrip circuit which carries the submillimeter wave output. A laser beam controlling the N Auston switches illuminates the backside of the integrated circuit substrate through a wedge-shaped refractive layer (such as quartz) which narrows in thickness along the direction of the linear array of Auston switches. The switch-to-switch spacing along the linear array corresponds to a time separation of $1/f$ for successive current pulses arriving at the output load.

The submillimeter wave output frequency may be varied or tuned as desired by tilting the array of Auston switches relative to the laser beam. This changes the optical path distance and thus the phase delay of the optical beams along the array.

Preferred Embodiments

Figure 1:
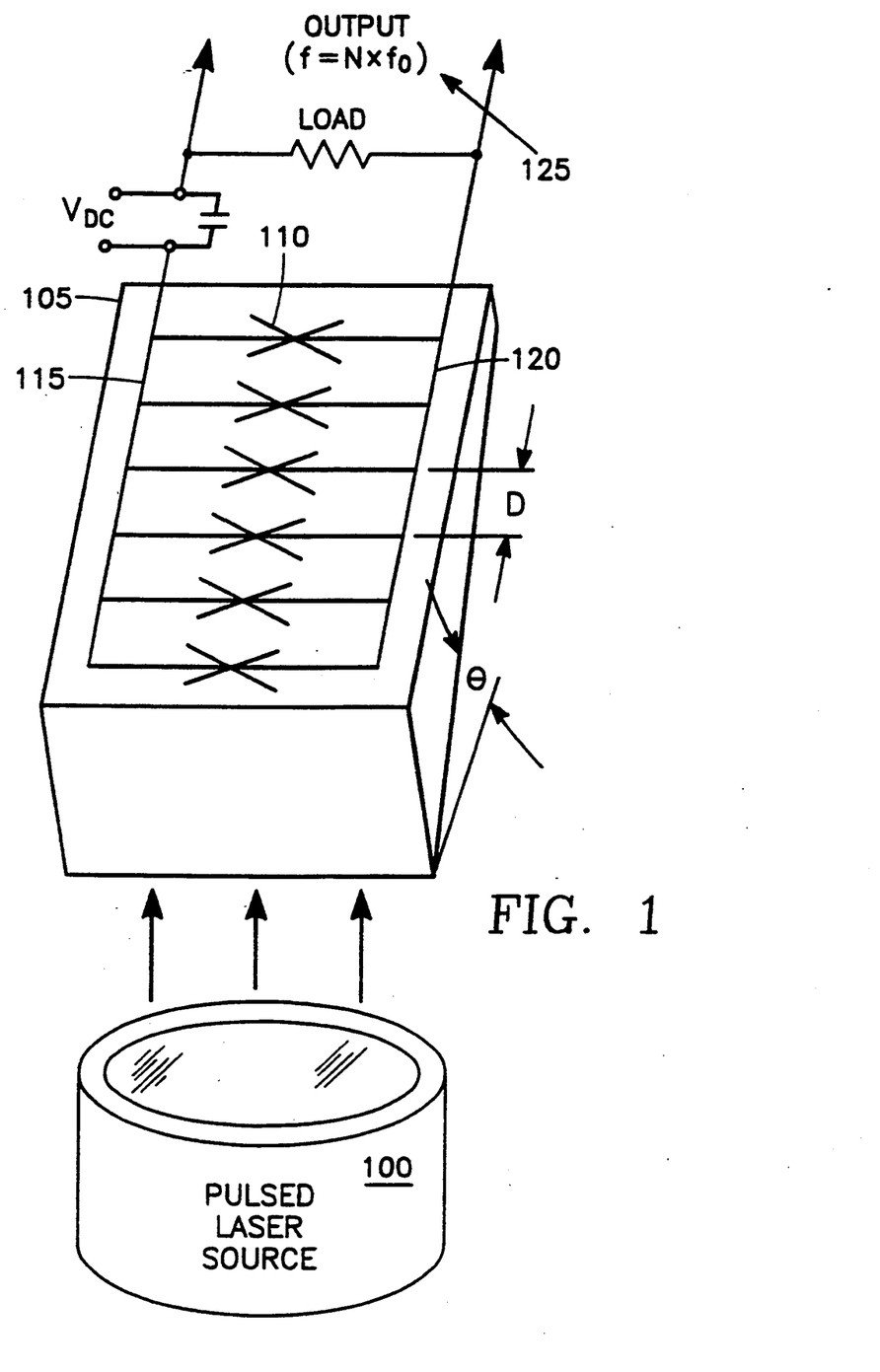
FIG. 1 is a perspective view of a first simplified embodiment of the invention employing microstrip elements.

Referring to the simplified embodiment of FIG. 1, a pulsed laser 100 illuminates the back side of an integrated circuit 105 through a refractive optical medium 107 having a wedge cross-section. The integrated circuit 105 consists of a linear array of N Auston switches 110 connected in parallel across a pair of conductors 115, 120 held at opposing potentials $V_{DC}$ and 0 to a load at the output of a microstrip output section 125. The wedge angle $\Theta$ of the refractive optical medium 107, as well as the thickness thereof and the switch-to-switch spacing D, determines the switch-to-switch time separation $1/f$ of the multiple current pulse delays at the load.

Preferably, the laser 100 has a pulse repetition rate or frequency $f_0$ in excess of 10 GHz and a rise time less than one picosecond. Since the laser turn-off time is not as critical, the laser 100 is preferably a low power compact semiconductor laser diode.

Figure 2:
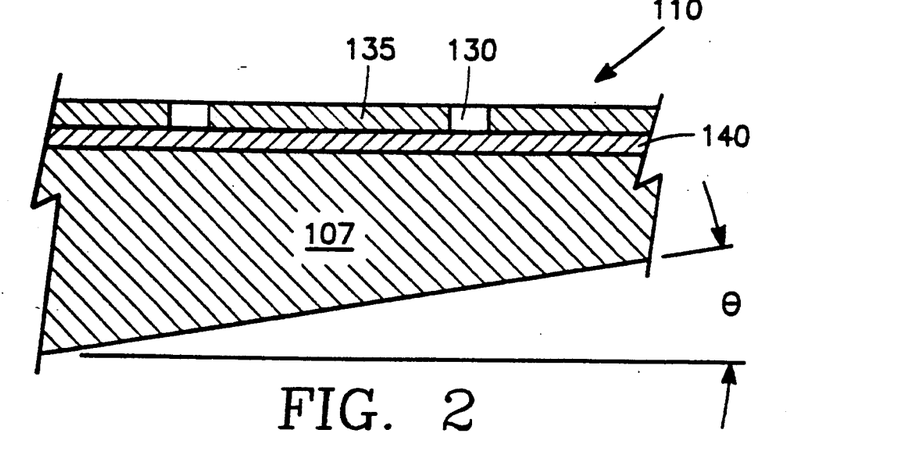
FIG. 2 is a side view corresponding to FIG. 1.

The Auston switches may be of the type disclosed by A. C. Warren et al., "Arsenic Precipitates and the Semi-insulating properties of GaAs Buffer Layers grown by Low-temperature Molecular Beam Epitaxy," *Applied Physics Letters,* Vol. 57, No. 13, page 1331 (1990). Basically, as illustrated in FIG. 2, each Auston switch 110 is a gap 130 in a metal conductor layer 135 overlying a highly resistive layer 140 such as semi-insulating GaAs or InP. Such a gap presents an electrical open or complete discontinuity in the electrical conductor path. Photons impinging on the semi-insulator layer 140 in the vicinity of the gap 130 create electron-hole pairs, permitting current to flow across the gap and effectively "closing" the Auston switch 110. Single switches of this type have been demonstrated with pulse widths of 0.46 picoseconds, as disclosed in the above-referenced publication to A. C. Warren et al. and also in Van Exter et al., "Characterization of an Optoelectronic Terahertz Beam System," *IEEE Transactions on Microwave Theory and Techniques,* Vol. 38, No. 11, page 1684 (1990).

Referring now to the preferred embodiment of FIGS. 3 through 6, an integrated circuit 145 is a linear array of Auston switches 150. The integrated circuit consists of a semi-insulating GaAs substrate 155, an AlGaAs barrier layer 160 and an active semi-insulating layer 165. Boundaries of the individual switches are defined by etching open voids 167 in the active layer 165 (using well-known selective etching techniques). (Alternatively, rather than etching open voids, an opaque material may be deposited over the substrate at each location 167.) The active layer 165 constitutes the region in which incident photons create electron-hole pair carriers and may be grown as described above. The barrier layer 155 and the open voids 170 in the active layer 165 maintain electrical separation between the switches 150.

The switches 150 are connected in parallel between a pair of parallel conductor busses 170, 175 held at potentials of $V_{DC}$ and ground, respectively. Both conductor busses are formed in a metal layer overlying the active layer 165. Each switch 150 is an Austin switch and constitutes a small gap 180 between opposing pairs of conductive fingers 170a, 175a of the busses 170, 175. Adjacent switches 150 are separated by a uniform spacing D between neighboring gaps 180, as indicated in FIG. 3.

A capacitance is integrated into the circuit to provide at TeraHertz frequencies the local charge demands as each individual switch 150 is triggered. The capacitance is maintained at the $V_{DC}$ charge by its continuous connection to the external $V_{DC}$ supply.

A dielectric or insulating layer 185 overlies a major portion of the second conductor bus 175. A capacitor plate 190 is formed as an upper metal layer overlying the dielectric layer 185 to form a thin film capacitor, constituting the conductor bus 175, the dielectric layer 185 and the capacitor plate 190. The upper capacitor plate 190 is connected as a continuous metal layer across a step 195 at one end of the dielectric layer 185 to a narrow conductor constituting an antenna 200 and to the conductor bus 170. The antenna 200 is a relatively narrow pattern in a half-loop configuration to give the appropriate inductance load.

Figure 3:
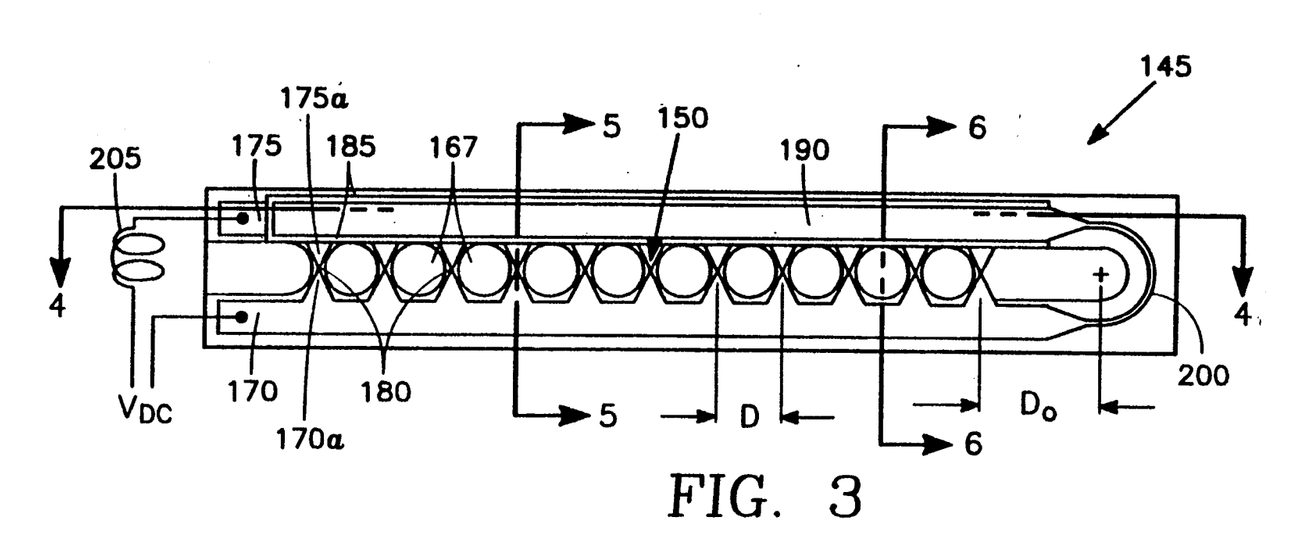
FIG. 3 is a top view of a second embodiment of the invention constituting a free space line radiator.
Figure 4:
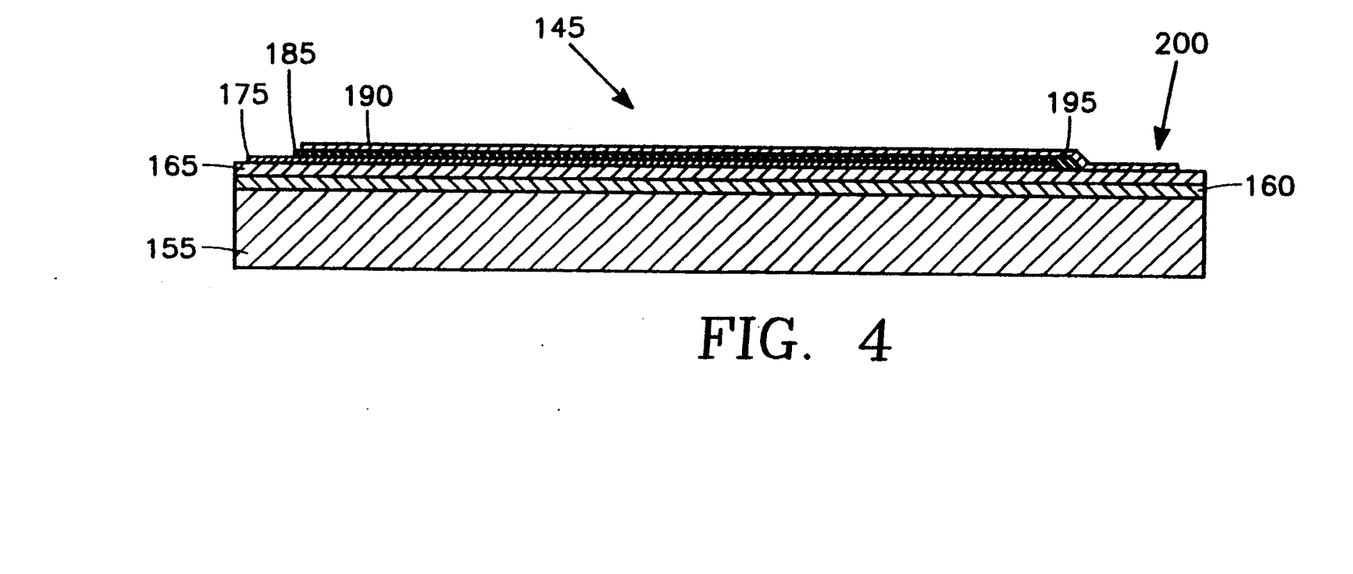
FIG. 4 is a side cut-away cross-sectional view corresponding to Section 4—4 of FIG.
Figure 5:
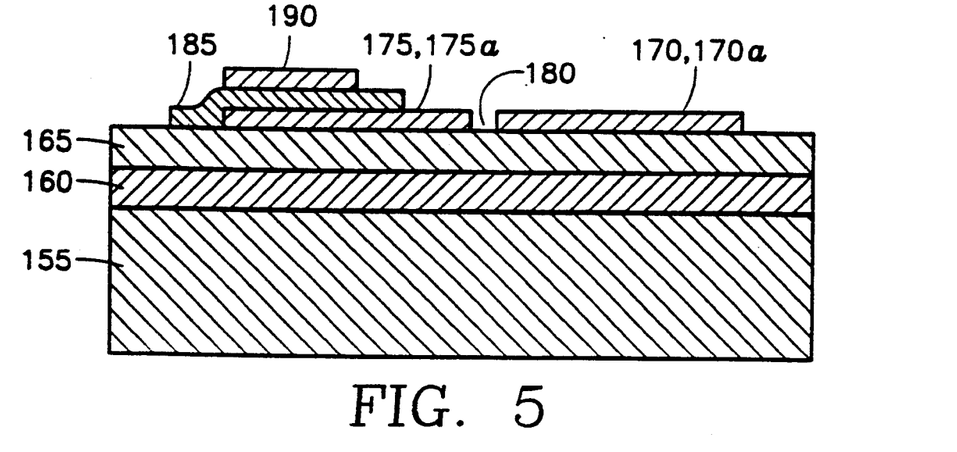
FIG. 5 is a cut-away cross-sectional corresponding to Section 5—5 of FIG. 3.
Figure 6:
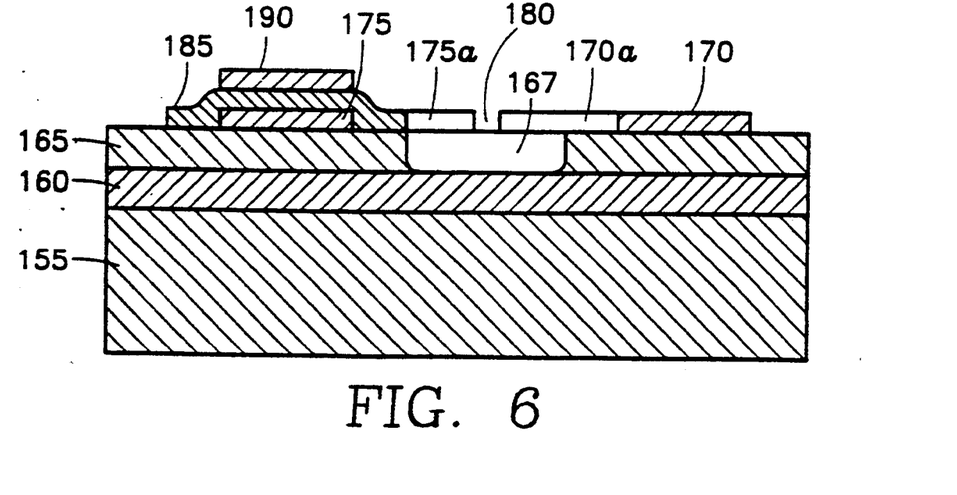
FIG. 6 is a cut-away cross-sectional view corresponding to Section 6—6 of FIG. 3.

The embodiment of FIG. 3 radiates submillimeter waves in free space out from the antenna 200, generally spherically in all directions. At relatively short distances, the antenna 200 appears as a point source of submillimeter radiation. Thus, the radiation from the antenna 200 can be focused with spherical quasi-optics.

Figure 7:
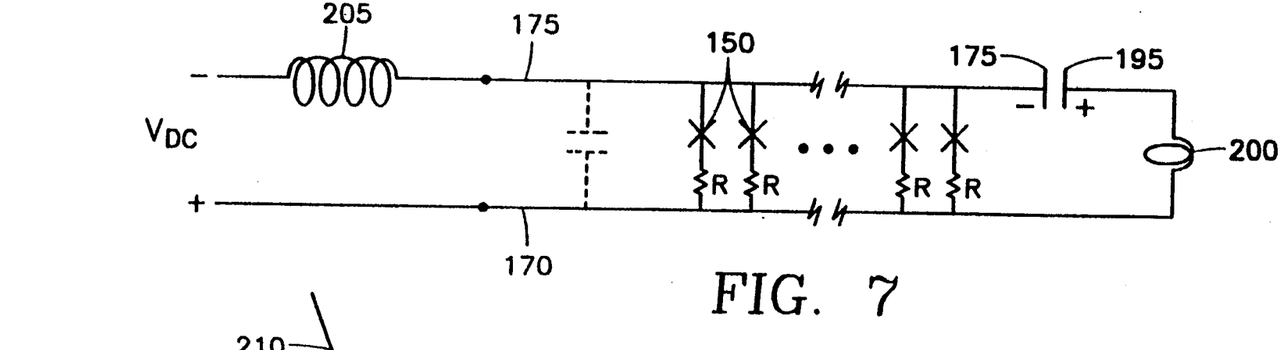
FIG. 7 is a simplified schematic diagram of an equivalent RC circuit corresponding to the embodiment of FIG. 3.

The equivalent RC circuit is illustrated in FIG. 7. An appropriate inductor 205 is connected in series between ground and the conductor bus 175 to limit AC power dissipation through the switches from the external voltage source. Each switch 150 has a characteristic resistance R while the antenna 200 has a characteristic inductance L. Typically, $R << 2\pi fL$. Under these conditions, the current through the antenna 200 is $V/2\pi fL$ so that the total power applied to the antenna 200 is $V^2/2\pi fL$. For example, if the submillimeter wave frequency $f=1$ THz, $2\pi fL \sim 100\Omega$ and $V_{DC} \sim 10$ volts, then the total power radiated by the antenna 200 would be on the order of one watt.

Figure 8:
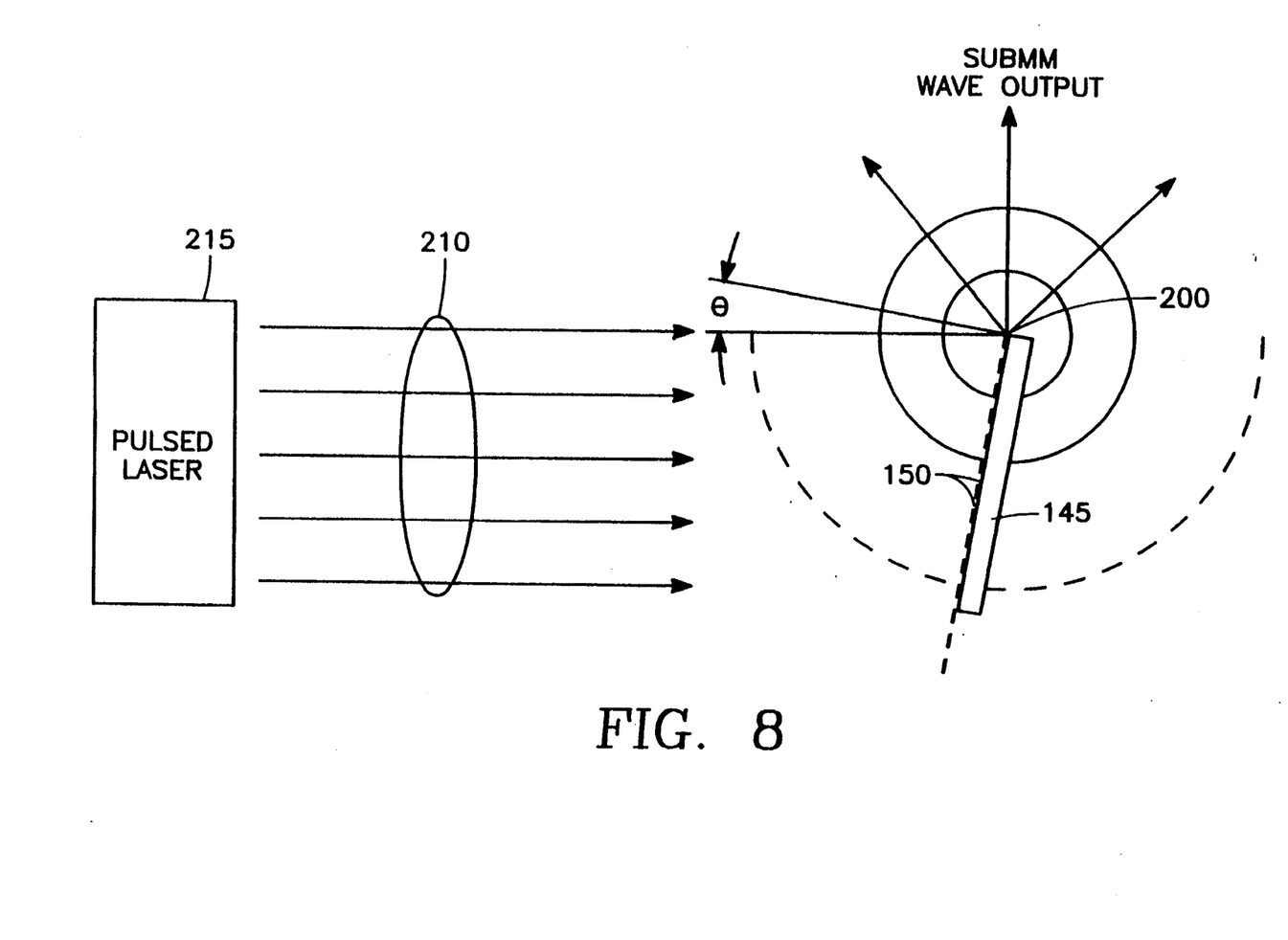
FIG. 8 is a simplified diagram illustrating a method of tuning the output frequency of the embodiment of FIG. 3.

The output millimeter wave frequency of the integrated circuit of FIG. 3 may be varied or tuned as desired in accordance with the method and apparatus illustrated in FIG. 8. A collimated pulsed laser beam 210 from a pulsed laser source 215 illuminates the integrated circuit 145 of FIG. 3. The integrated circuit 145 is oriented so that a vector normal to the linear array of switches 150 is disposed at an angle $\Theta$ relative to the direction of the incoming laser beam 210. The angle $\Theta$ is measured about an axis of rotation coincident with the antenna 200. If the integrated circuit 145 supports N Auston switches 150 with uniform spacing D and has an effective index of refraction n (in the composite media of air and substrate), then the time $t_N$ required for the pulse from the triggering of the $N^{th}$ switch 150 to travel the entire length of the array of N switches 150 and the additional distance $D_0$ to the antenna 200 is given by:

$$t_N = nD_0/c + n(ND/c) - (ND/c)(\sin \Theta) \quad (1)$$

$$= nD_0/c + (ND/c)(n - \sin \Theta), \quad (2)$$

where c is the speed of light in a vacuum. Differentiating with respect to N provides the switch-to-switch delay $\delta t_N = 1/f$:

$$\delta t_N = 1/f = (D/c)(n - \sin \Theta), \quad (3)$$

or $$f = (c/D)/(n - \sin \Theta). \quad (4)$$

It should be noted that if the integrated circuit were rotated through 180° so that the position of the antenna 200 were reversed, then the sign of the last factor in Equation (4) would be reversed, so that:

$$f = (c/D)/(n + \sin \Theta). \quad (5)$$

Thus, the output frequency f is a function of the angle $\Theta$ and may be tuned by rotating the integrated circuit 145 relative to the collimated laser beam 210 to change the angle $\Theta$. This applies to the embodiment of FIG. 1 as well. As one example, the switch spacing D may 0.006 cm, n may be 3 and $\Theta = 0$, in which case $f = 1.7$ TeraHertz, according to Equation (4). In this example, if the integrated circuit 145 is rotated to increase $\Theta$ to 30°, then $f = 2.0$ TeraHertz according to Equation (4), an increase in output frequency of 300 GigaHertz. As another example, the frequency may be set to a low value by selecting a larger switch spacing, such as $D = 0.03$ cm. In this example, if $\Theta = 0$ and $n = 3$, then the output frequency $f = 0.33$ TeraHertz according to Equation (4).

Figure 9:
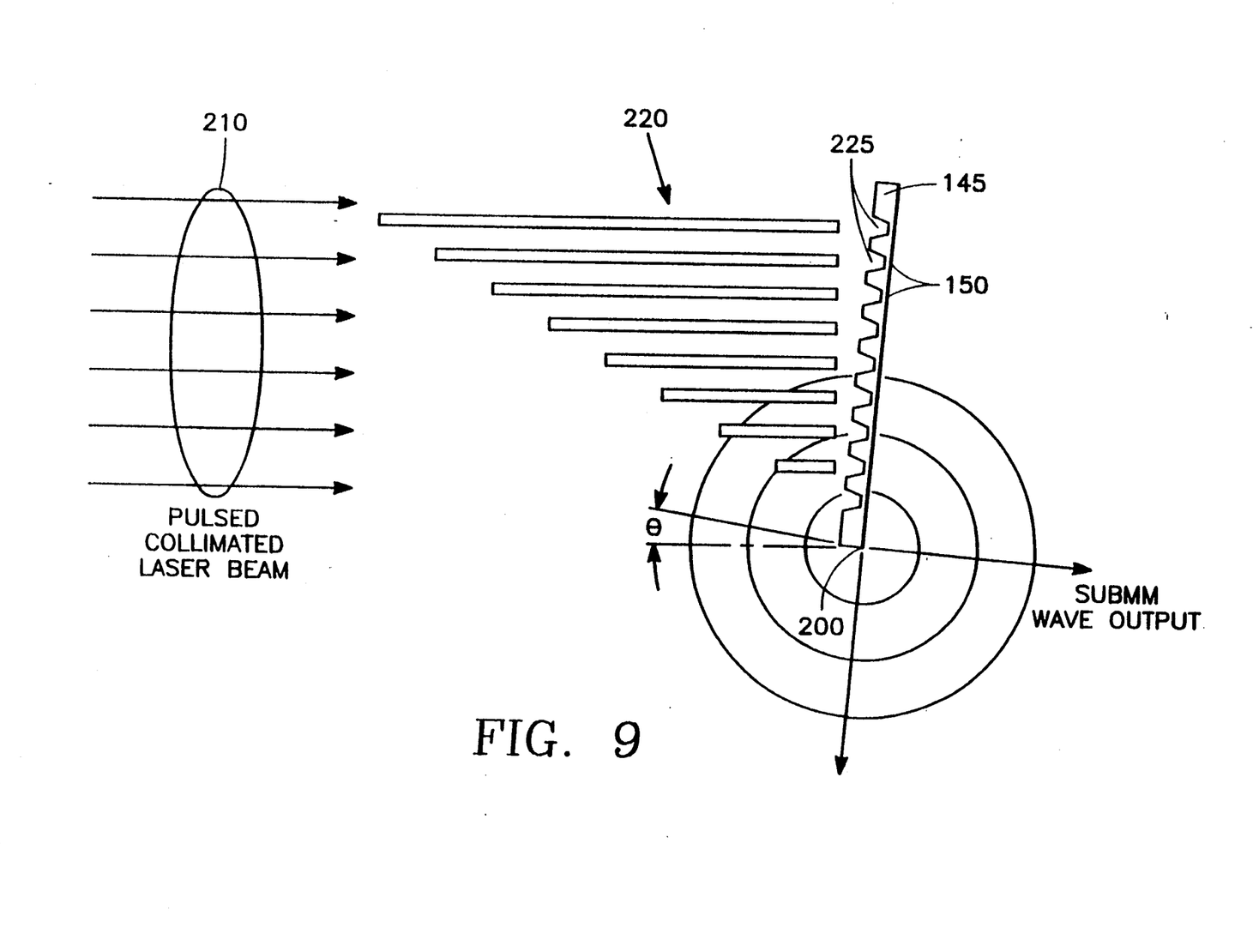
FIG. 9 is a simplified diagram illustrating a first alternative embodiment of the invention and a method for tuning the output frequency thereof.

For additional flexibility in designing the desired delays, FIG. 9 illustrates an embodiment like that of FIG. 3 and additionally including a set of optical fibers 220 of incrementally increasing lengths aligned with the linear array of switches 150 and disposed in the path of the pulsed laser beam 210. Each optical fiber 220 imposes a different delay on the light received by the respective switch 150, the delay increasing progressively from one end of the linear array of switches 150 to the other end thereof. This is equivalent to the function of the wedge-shaped optical material 107 of FIG. 2. The back side of the integrated circuit 145 has a plurality of etched cavities 225 aligned with respective optical fibers 220. In the embodiment of FIG. 9, the integrated circuit 145 may be rotated through an angle $\Theta$ to adjust the output frequency as in FIG. 8. If the integrated circuit 145 of FIG. 9 is oriented so that the antenna 200 is located closest to the laser beam source, and if the optical fibers have an index of refraction $n_f$ and respective integer multiple lengths from b (the shortest optical fiber 220) to Nb (for the longest or $N^{th}$ optical fiber 220), then the time delay for a pulse triggered by the $N^{th}$ switch 150 to reach the antenna 200 is:

$$t_N = (Nb/c)(n_f - 1) + (ND/c) \sin \Theta + NDn/c + D_0n/c. \quad (6)$$

As before, the sign of the last two terms of Equation (6) reverses if the integrated circuit 145 is rotated by 180°. Thus, the incremental unit b of the optical fibers 220 may be selected to increase or decrease the fundamental submillimeter output frequency, while rotations about $\Theta$ provide tunability of the output frequency.

While the invention has been described with reference to embodiments in which the laser pulse repetition rate $f_0$ is ideally constrained by the number N of switches 150 and the desired millimeter wave output frequency f in accordance with $f_0=f/N$, this constraint is not absolutely necessary. The effect of fulfilling this constraint is to provide a new laser pulse as soon as the last or $N^{th}$ switch-triggered pulse has reached the antenna 200. In this way, there is no period of time longer than one switch-to-switch delay $\delta t_N$ during which a switch is not triggered, so that a laser-triggered switch pulse reaches the antenna 200 once every $\delta t_N$ seconds. However, it not necessary that pulses constantly reach the antenna 200, so that a lower laser pulse repetition rate $f_0$ may be employed. This would entail some delay between the end of the first burst of N pulses to the antenna triggered by a first laser pulse and the next burst of N pulses to the antenna triggered by the next laser pulse. The only disadvantage of such a delay is that the power content of the Fourier component at the desired output frequency f is reduced accordingly.

Figure 10:
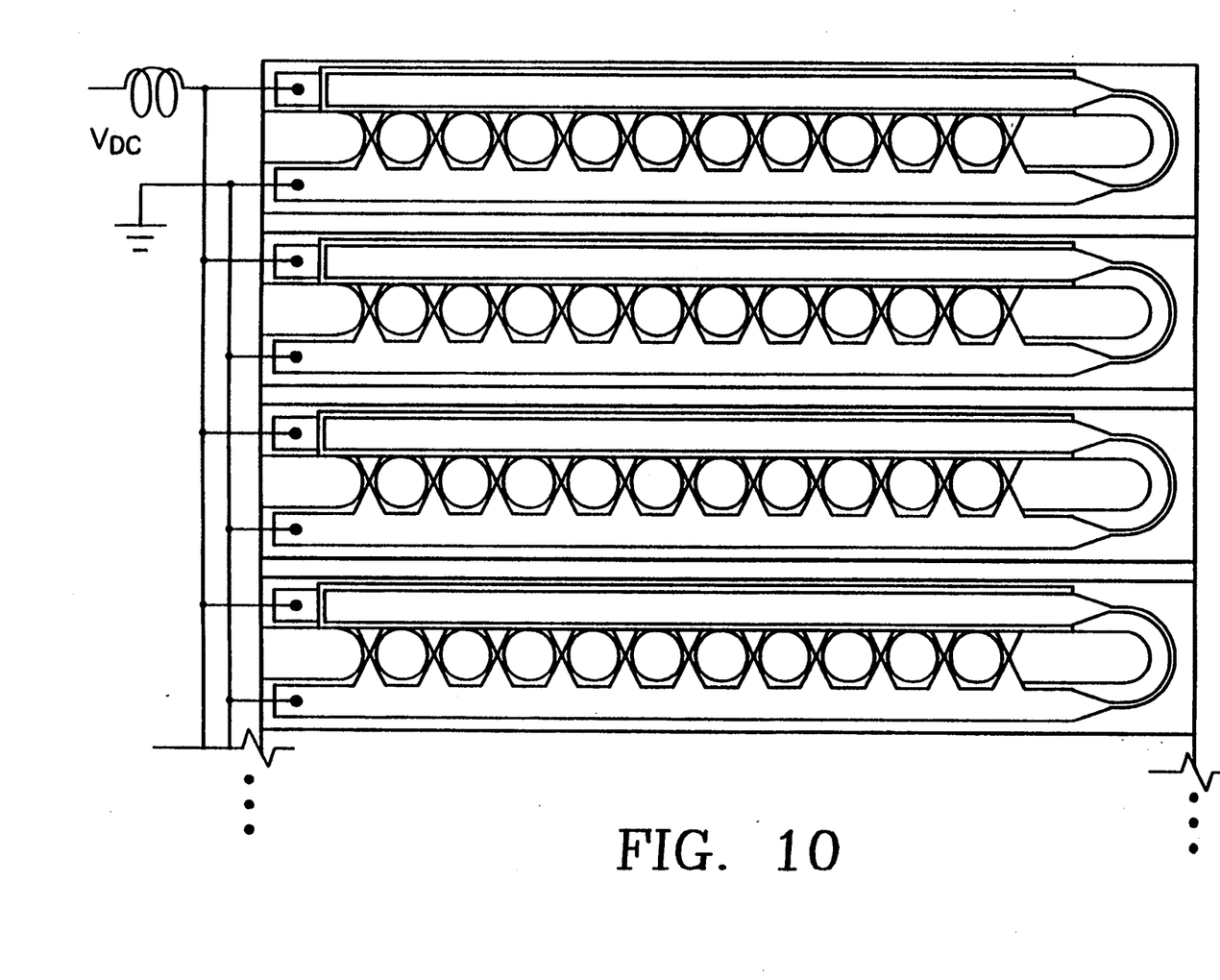
FIG. 10 is a top view of a two-dimensional array of plural line radiators of the type illustrated in FIG. 3.

FIG. 10 illustrates an alternative embodiment of the invention in which many linear switch arrays of the type illustrated in FIG. 3 are formed together on the same integrated circuit as a two dimensional array of plural parallel linear arrays. The linear array of antennas 200 of FIG. 10 constitutes in effect a submillimeter wave line radiator. Such a line radiator will have greater power output and may be effectively integrated with cylindrical quasi-optics in a submillimeter wave system.

Figure 11:
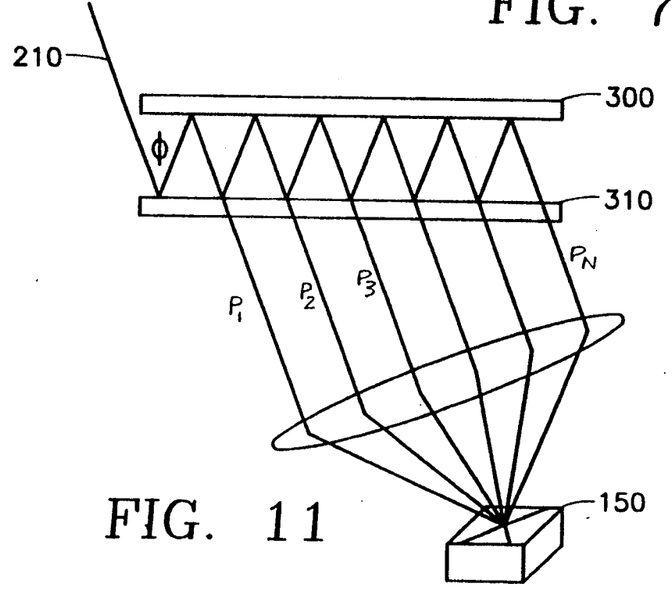
FIG. 11 is a simplified diagram of an optical setup corresponding to a second alternative embodiment.

In all of the embodiments described herein thus far, it is contemplated that the integrated circuit 145 is no greater than the beam size or modestly expanded beam size of a typical pulse laser, typically no more than a few millimeters. Thus, the beam illuminates all of the switches 150 without requiring special optical effects. However, in the embodiment of FIG. 11, a relatively narrow beam from a pulsed laser can sequentially illuminate through separate optical paths P1, P2, P3, etc., a single photoconductive switch 150 with the desired time sequence. For this purpose, the pulsed laser beam 210 enters a cavity formed between a 100% reflecting mirror 300 and a multi-step coated reflector 310 at an angle $\Phi$. As shown in FIG. 11, the beam 210 is partially reflected by the coated reflector 310 and fully reflected by the mirror 300 so that it forms multiple reflections. Light transmitted through the coated reflector travels along the paths P1, P2, P3, etc. The light paths P1, P2, P3, and so forth are then focused onto a single photoconductive switch 150 connected as in FIG. 1. The separation between the mirror 300 and the reflector 310 and the angle of incidence $\Phi$ are selected so that the optical paths P1, P2, P3, . . . , $P_N$ provide the delay time difference $\delta t$ at the switch 150. The arrival of pulses at the switch at intervals $\delta t$ corresponds to a submillimeter wave output frequency $f=1/\delta t$.

This latter approach is limited by the number (N) of delay paths (i.e., P1, P2, P3, . . . , $P_N$) because of the attenuating effect of the partial reflections and transmissions. Therefore, since $f \sim Nf_0$, the frequency enhancement of the output frequency f over the laser repetition rate $f_0$ is correspondingly limited.

While the invention has been described in detail by specific reference to preferred embodiments thereof, it is understood that variations and modifications thereof may be made without departing from the true spirit and scope of the invention.

What is claimed is:

1. A submillimeter wave-generating circuit, comprising:
   a linear array of plural photoconductive switches;
   means for biasing said switches across a common voltage source;
   an output load connected to one end of said array; and
   means for applying an optical pulse beam of repetition rate $f_0$ to said plural switches so as to generate electrical pulses from said switches traveling along said linear array toward said output load, wherein said plural switches are spaced apart by a spacing D to provide a corresponding switch-to-switch propagation delay of said electrical pulses, whereby arrival times of said electrical pulses at said output load are spaced apart by an arrival period corresponding to a desired submillimeter wave frequency f which is a function of said switch-to-switch propagation delay.

2. The circuit of claim 1 further comprising:
   optical delay means for delaying arrival of said optical pulse at successive ones of said switches with successively increasing optical delay times corresponding to a switch-to-switch optical delay difference, whereby said arrival period corresponding to said submillimeter wave frequency f is a function of both said switch-to-switch propagation delay and said optical delay difference.

3. The circuit of claim 2 further comprising tuning means for varying said optical delay difference so as to change said submillimeter wave frequency f.

4. The circuit of claim 1 wherein said array of switches comprises a number of switches not exceeding N, wherein N is on the order of $f/f_0$.

5. The circuit of claim 4 wherein said optical pulse has a repetition rate on the order of 10 GHz and N is on the order of 100, whereby said circuit generates radiation of frequency greater than 1 Terahertz.

6. The circuit of claim 2 wherein said optical delay means comprises means for disposing said linear array at an angle $\Theta$ relative to said optical pulse.

7. The circuit of claim 6 wherein said arrival period is independent of N and is $1/f=(D/c)(n-\sin\Theta)$, wherein c is the speed of light and n is an applicable index of refraction.

8. The circuit of claim 2 wherein said optical delay means comprises a wedge-shaped optical medium between a source of said optical pulse and said array of switches.

9. The circuit of claim 8 wherein said optical delay means comprises an array of optical fiber channels of successively increasing optical lengths disposed generally perpendicular to said array of switches, each optical fiber channel facing a respective one of said switches, respective ones of said optical fiber channels having respective lengths corresponding to respective optical delays.

10. The circuit of claim 1 wherein said means for biasing comprises metal conductors overlying a highly resistive photoconductive layer and having gaps therein forming each of said switches, said circuit further comprising:
    a thin film insulated capacitor plate connected to one of said conductors and overlying another one of said conductors along a major portion of the length of the other conductor, said capacitor plate providing a local charge source for each of said switches.

11. The circuit of claim 10 wherein said output load comprises a free-space radiating antenna connected across said metal conductors.

12. The circuit of claim 11 wherein one end of said capacitor plate and one end of said one conductor lie at one end of said array of switches, said antenna being connected across said one end of said capacitor plate and said one end of said one conductor.

13. A free-space radiating multi-watt submillimeter wave source, comprising:
- an integrated circuit substrate;
- an optically active semiconductor layer overlying said substrate;
- a linear array of opposing metal finger pairs overlying said optically active layer with thin gaps between opposing fingers of each pair, adjacent ones of said gaps being separated by a uniform spacing D for a gap-to-gap propagation delay corresponding to a submillimeter wave frequency regime;
- a pair of bias bus conductors connected to respective ones of said opposing metal finger pairs;
- an antenna connected at a first terminal thereof to one of said bias bus conductors at one end of said linear array; and
- a thin film capacitor having one capacitor plate overlying a major portion of one of said bias bus conductors and connected to a second terminal of said antenna and a dielectric layer lying between said capacitor plate and the underlying one bias bus conductor.

14. The millimeter wave source of claim 13 further comprising a pulsed optical beam source.

15. The millimeter wave source of claim 14 further comprising means for preventing light from interacting with said optically active semiconductor layer in a region between adjacent finger pairs.

16. The submillimeter wave source of claim 15 wherein said means for preventing light from interacting with said optically active semiconductor layer in a region between adjacent finger pairs comprises open voids in said optically active semiconductor layer in regions bounded by adjacent ones of said gaps.

17. The submillimeter wave source of claim 15 wherein said means for preventing light from interacting with said optically active semiconductor layer in a region between adjacent finger pairs comprises an opaque layer overlying discrete regions of said optically active semiconductor layer between adjacent ones of said gaps.

18. The submillimeter wave source of claim 16 further comprising means for imposing respective optical delays on arrival of a pulsed optical beam at successive ones of said gaps, whereby said antenna radiates at a submillimeter wave frequency which is a function of both said gap-to-gap propagation delay and a difference between said optical delays at adjacent gaps.

19. The submillimeter wave source of claim 18 wherein said means for imposing optical delays comprises a wedge-shaped optical medium in an optical path to said gaps.

20. The submillimeter wave source of claim 18 wherein said means for imposing optical delays comprises plural successive optical fibers of successively increasing lengths in alignment with respective ones of said gaps at one end thereof for receiving a pulsed optical beam at an opposite end thereof.

21. The submillimeter wave source of claim 18 wherein said means for imposing optical delays comprises means for disposing said array at an off-normal angle relative to an incident pulsed optical beam.

22. A submillimeter wave-generating circuit, comprising:
- a two-dimensional planar array of photoconductive switches comprising plural linear arrays of said plural photoconductive switches;
- means for biasing said switches across a common voltage source;
- an output load connected to one end of each one of said linear arrays; and
- means for applying an optical pulse beam of repetition rate $f_0$ to said plural switches so as to generate electrical pulses from said switches traveling along each one of said linear arrays toward the respective output loads, wherein said plural switches within each linear array are spaced apart by a spacing D to provide a corresponding switch-to-switch propagation delay of said electrical pulses, whereby arrival times of said electrical pulses at each one of said output loads are spaced apart by an arrival period corresponding to a desired submillimeter wave frequency f which is a function of said switch-to-switch propagation delay.

23. The circuit of claim 22 further comprising:
- optical delay means for delaying arrival of said optical pulse at successive ones of said switches in each linear array with successively increasing optical delay times corresponding to a switch-to-switch optical delay difference, whereby said arrival period corresponding to said submillimeter wave frequency f is a function of both said switch-to-switch propagation delay and said optical delay difference.

24. The circuit of claim 23 further comprising tuning means for varying said optical delay difference so as to change said submillimeter wave frequency f.

25. The circuit of claim 22 wherein each one of said linear arrays of switches comprises a number of switches not exceeding N, wherein N is on the order of $f/f_0$.

26. The circuit of claim 25 wherein said optical pulse has a repetition rate on the order of 10 GHz and N is on the order of 100, whereby said circuit generates radiation of frequency greater than 1 Terahertz.

27. The circuit of claim 23 wherein said optical delay means comprises means for disposing said linear array at an angle $\Theta$ relative to said optical pulse.

28. The circuit of claim 27 wherein said arrival period is independent of N and is $1/f = (D/c)(n - \sin \Theta)$, wherein c is the speed of light and n is an applicable index of refraction.

29. A submillimeter wave source, comprising:
- a photoconductive switch biased across a voltage source and having an output load coupled thereto;
- means for generating multiple delayed reflections of a single pulsed optical beam of repetition rate $f_0$, successive ones of said reflections being spaced in time by successive optical delay differences corresponding to a submillimeter wave frequency f; and
- means for focusing said multiple delayed reflections of said beam onto said photoconductive switch.

30. The submillimeter wave source of claim 29 wherein said means for generating multiple delayed reflections comprises a mirrored cavity having a top reflective surface and a bottom surface facing said top reflective surface, said bottom reflective surface being partially reflective and partially transmissive in a direction toward said means for focusing.

31. The submillimeter wave source of claim 29 wherein said means for generating said reflections generates N reflections of said beam, wherein $N=f/f_0$.

32. A method of generating submillimeter wave radiation using an integrated circuit having a linear array of photoconductive switches biased across a voltage source with an output load at one end thereof and characterized by a spacing D corresponding to a switch-to-switch propagation delay, said method comprising:

illuminating said linear array with a pulsed laser beam of repetition rate $f_0$;

holding said array at an angle $\Theta$ relative to a normal to an optical path of said laser beam so as to impose an optical delay difference in arrival of each pulse of said beam at adjacent ones of said switches.

33. The method of claim 32 wherein said output load receives successive pulses from said switches at a submillimeter wave frequency $f=1/[(D/c)(n-\sin\Theta)]$, wherein c is the speed of light and n is a factor related to an index of refraction.

34. The method of claim 32 further comprising varying said angle $\Theta$ so as to change the frequency of said submillimeter wave radiation.

* * * * *